(12) United States Patent
Hummel et al.

(10) Patent No.: US 10,257,922 B2
(45) Date of Patent: Apr. 9, 2019

(54) METHOD FOR REDUCING CONDUCTOR TRACK SPACING IN ELECTRONIC CIRCUIT BOARDS AND ELECTRONIC CIRCUIT BOARD WITH REDUCED SPACING BETWEEN CONDUCTOR TRACKS

(71) Applicant: OSRAM GmbH, Munich (DE)

(72) Inventors: Peter Hummel, Munich (DE); Stefan Mannhardt, Muensing (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 15/773,205

(22) PCT Filed: Oct. 19, 2016

(86) PCT No.: PCT/EP2016/075049
§ 371 (c)(1),
(2) Date: May 3, 2018

(87) PCT Pub. No.: WO2017/076641
PCT Pub. Date: May 11, 2017

(65) Prior Publication Data
US 2018/0324942 A1   Nov. 8, 2018

(30) Foreign Application Priority Data

Nov. 5, 2015   (DE) .................. 10 2015 221 688

(51) Int. Cl.
*H05K 7/02*   (2006.01)
*H02H 9/04*   (2006.01)
(Continued)

(52) U.S. Cl.
CPC ......... *H05K 1/0256* (2013.01); *H05K 1/0262* (2013.01); *F21V 23/02* (2013.01); *F21Y 2115/10* (2016.08); *H05K 2201/09227* (2013.01)

(58) Field of Classification Search
None
See application file for complete search history.

(56) References Cited

U.S. PATENT DOCUMENTS 5,995,353 A * 11/1999 Cunningham ............ H01T 4/08
 361/111
6,489,680 B2 * 12/2002 Kohjiro ................... H01L 23/04
 257/728

(Continued)

FOREIGN PATENT DOCUMENTS

DE   102005046282 A1   3/2007
EP   1289341 A2   3/2003

OTHER PUBLICATIONS

International Search Report based on application No. PCT/EP2016/075049 (7 pages + 3 pages English translation) dated Jan. 31, 2017 (for reference purpose only).

*Primary Examiner* — Dimary S Lopez Cruz
(74) *Attorney, Agent, or Firm* — Viering, Jentschura & Partner MBB

(57) ABSTRACT

A method for reducing conductor track spacings in a printed circuit board, wherein the printed circuit board has an input part, wherein the input part is fed by a supply voltage, and has an output part, comprising the following steps: inserting an intermediate conductor track which has an intermediate potential derived from the input part, maintaining a functional insulation gap between the intermediate conductor track and adjacent conductor tracks of the input part, maintaining a safety-relevant insulation gap between the intermediate conductor track and the adjacent conductor tracks of the output part. The intermediate potential has, with respect to adjacent conductor tracks of the output part, a voltage which corresponds at most to the supply voltage of the input part.

12 Claims, 4 Drawing Sheets

(51) Int. Cl.
*H05K 1/02* (2006.01)
*F21Y 115/10* (2016.01)
*F21V 23/02* (2006.01)

(56) References Cited

U.S. PATENT DOCUMENTS

| | | | |
|---|---|---|---|
| 2002/0158590 | A1 | 10/2002 | Saito et al. |
| 2006/0087821 | A1* | 4/2006 | Makino .................. H05K 1/023 |
| | | | 361/777 |
| 2010/0039838 | A1 | 2/2010 | Carpenter |
| 2010/0284134 | A1* | 11/2010 | Chen ........................ G11C 5/04 |
| | | | 361/679.02 |
| 2012/0127684 | A1 | 5/2012 | Matsumoto et al. |
| 2013/0269982 | A1* | 10/2013 | Teofilovic ............ H05K 1/0256 |
| | | | 174/148 |
| 2013/0333932 | A1* | 12/2013 | Johnson ............. H01L 31/0203 |
| | | | 174/260 |
| 2013/0342968 | A1* | 12/2013 | Peterson ............. H05K 7/1457 |
| | | | 361/622 |

* cited by examiner

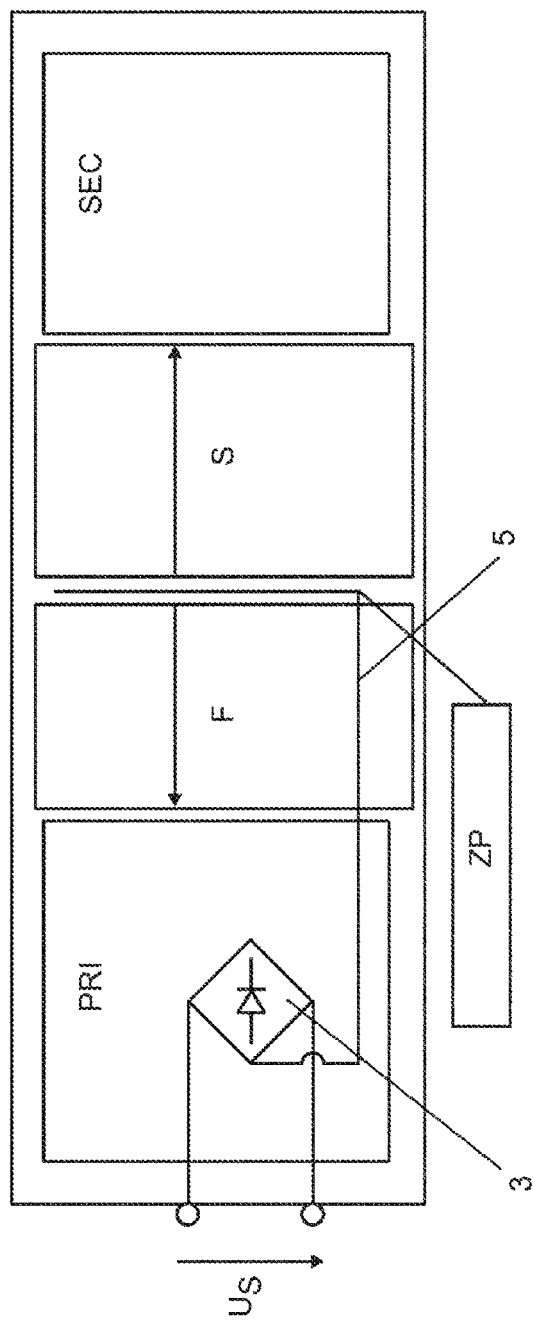

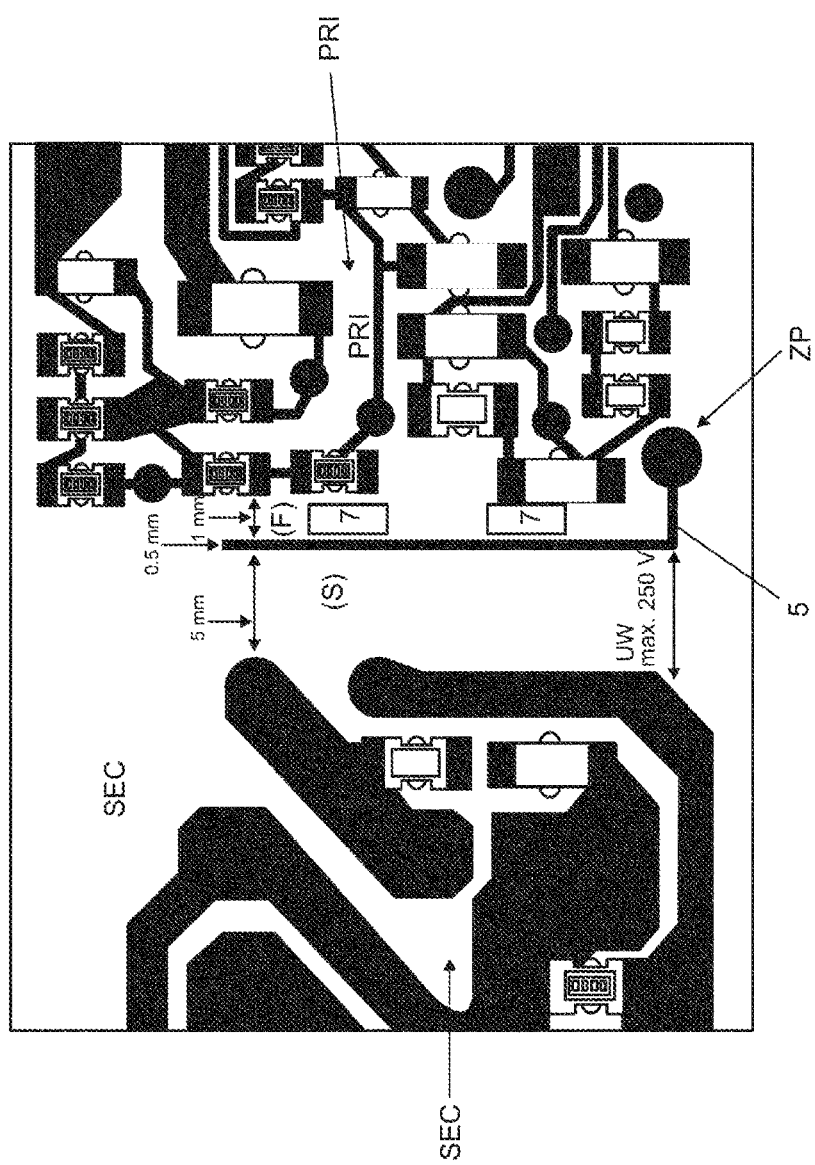

METHOD FOR REDUCING CONDUCTOR TRACK SPACING IN ELECTRONIC CIRCUIT BOARDS AND ELECTRONIC CIRCUIT BOARD WITH REDUCED SPACING BETWEEN CONDUCTOR TRACKS

CROSS-REFERENCE TO RELATED APPLICATION

The present application is a national stage entry according to 35 U.S.C. § 371 of PCT application No.: PCT/EP2016/075049 filed on Oct. 19, 2016, which claims priority from German Patent Application Serial No.: 10 2015 221 688.8 which was filed Nov. 5, 2015, and is incorporated herein by reference in its entirety and for all purposes.

TECHNICAL FIELD

The description relates to a method for reducing conductor track spacings on a printed circuit board, and to a corresponding printed circuit board with reduced conductor track spacings.

BACKGROUND

The description is based on a method for reducing conductor track spacings of a printed circuit board and on a printed circuit board with a circuit arrangement with reduced conductor track spacings according to the generic type of the main claim.

Switched-mode power supplies may be subdivided into two groups in principle, DC-insulated and non-insulated switched-mode power supplies. Insulated switched-mode power supplies have an input part and an output part which is electrically insulated from said input part. The input part carries mains voltage and is configured such that it cannot be touched by a user.

For handling and cost reasons, the output is usually designed to be insulated from the mains voltage. The insulated output voltage may lie in the SELV range (up to 120 V), but also have higher voltages.

The insulated output voltage allows a considerably reduced expenditure on insulation in LED modules which is highly advantageous for thermal reasons and allows compact designs.

Especially in the case of switch-mode power supplies which are provided for LED illumination, insulated SELV-compliant switched-mode power supplies are very common since the LEDs require adequate cooling at relatively high powers and are sometimes mounted on relatively large metallically conductive heat sinks which may be touched from the outside. In order to be able to comply with the relevant safety standards, such as IEC 61347-1, safety spacings are provided between the input part, which cannot be touched, and the output part (which may be touched), it being necessary to maintain said safety spacings in the form of a creepage distance.

FIG. 1 shows a schematic illustration of a design of an insulated switched-mode power supply according to the prior art which complies with the safety standard according to IEC 61347-1. The input part PRI, which is fed by the mains voltage $U_S$, is separated from the output part SEC by a safety spacing S. The creepage distances which have to be maintained in accordance with IEC 61347-1 are defined depending on the maximum occurring voltage between the corresponding components.

FIG. 2 shows, by way of example, a detail of a printed circuit board layout of a design according to the prior art which complies with the safety standard according to IEC 61347-1. The right-hand part of the layout includes the input part PRI, which has mains voltage-carrying conductive parts (components, conductor tracks, . . . ), and is mechanically configured such that voltage-carrying parts cannot be touched from the outside. This may be achieved by corresponding design of the housing and the connection terminals of the switched-mode power supply. The output part SEC is arranged on the left-hand side of the layout. The output part is configured such that it may be touched since a safe extra-low voltage is produced at its output, and the LED modules which are to be operated by the switched-mode power supply, for example, may be touched.

A creepage distance according to IEC 61347-1 is provided between the input part PRI and the output part SEC. This standard prescribes particular creepage distances on the basis of the voltages between two components between the input part and the output part.

FIG. 2 illustrates, by way of example, different required creepage distance spacings with reference to the voltage which is applied between the corresponding conductive parts.

The maximum occurring first voltage $U_1$ between the corresponding components is, for example, 432 V. According to IEC 61347-1, a minimum creepage distance of 8.64 mm between the corresponding components is provided for this voltage.

The maximum occurring second voltage $U_2$ between the corresponding components is, for example, 378 V. According to IEC 61347-1, a minimum creepage distance of 7.56 mm between the corresponding components is provided for this voltage.

The maximum occurring third voltage $U_3$ between the corresponding components is, for example, 544 V. According to IEC 61347-1, a minimum creepage distance of 10.8 mm between the corresponding components is provided for this voltage.

The maximum occurring fourth voltage $U_4$ between the corresponding components is, for example, 170 V. According to IEC 61347-1, a minimum creepage distance of 3.4 mm between the corresponding components is provided for this voltage.

Especially in the case of flyback converters, high voltages may occur in some components for functional reasons and, in practice, this may lead to large required creepage distances at the third voltage $U_3$. This increases the required installation volume of the switched-mode power supply and is therefore undesirable. Specifically in the case of switched-mode power supplies in illumination engineering, it is usual to use so-called add-on boards in the case of relatively complex designs, said add-on boards being fitted on the main circuit board vertically in order to save length on the main circuit board. Here, relatively small creepage distances could make space for components, and add-on boards could be dispensed with.

SUMMARY

A method and a printed circuit board with a circuit arrangement may reduce the required safety spacings given the creepage distances of the printed circuit board with the circuit arrangement.

According to the description, the required safety spacings given the creepage distances of the printed circuit board with the circuit arrangement may be reduced by a method for reducing conductor track spacings in a printed circuit board, wherein the printed circuit board has an input part, which is fed by a supply voltage, and has an output part, characterized by the steps of inserting an intermediate conductor track which has an intermediate potential which is derived from the input part, maintaining a functional insulation gap between the intermediate conductor track and adjacent conductor tracks of the input part, maintaining a safety-relevant insulation gap between the intermediate conductor track and the adjacent conductor tracks of the output part, wherein the intermediate potential has, with respect to adjacent conductor tracks of the output part, a voltage which corresponds at most to the supply voltage of the input part.

Owing to the insertion according to the non-limiting embodiment of an intermediate potential between the input part and the output part, the prescribed creepage distances may be maintained more easily since they are substantially smaller with suitable selection of the potential. The voltage spacings of the intermediate potential with respect to the input part are not subject to any normative safety prescriptions and may be kept very small by suitable measures. Therefore, overall, the space requirement on a printed circuit board is significantly improved on account of the smaller spacings between the conductor tracks, in spite of the insertion of the intermediate conductor track between the input part and the output part.

In principle, the voltage of the intermediate potential with respect to adjacent conductor tracks of the output part may also be higher than the supply voltage if this voltage is functionally very close to the potential of the conductive parts in the insulating region of the input part.

It should be stressed that the safety-relevant creepage distances between the intermediate potential and the output part are oriented to the respectively highest occurring voltage.

In a customary design variant, the input part is configured such that it cannot be touched. This is already necessary on account of the mains voltage of 230 V or 120 V customary in most countries.

The output part preferably has components which may be touched. This greatly improves the handling of the entire system since LED modules which are configured as individual circuit boards without housings are often connected to the output part, and therefore voltage-carrying potentials may be touched. Since these modules are usually operated at an SELV voltage of less than 60 V, this does not present a safety problem.

However, it is not absolutely necessary that the output part may be touched; the non-limiting embodiment also has considerable advantages over the prior art even in the case of an output part which cannot be touched.

In a non-limiting embodiment, the intermediate potential is generated from the potential at the negative output of a bridge rectifier which is located in the input part. This measure is particularly simple to implement and the potential at the negative output of a bridge rectifier which is located in the input part is particularly suitable for the method according to the description.

In another non-limiting embodiment, the intermediate potential has a potential which corresponds to a lower voltage than the voltage between the input part and the output part with respect to a ground potential or a potential of the neutral conductor of the supply voltage. Therefore, if the intermediate potential is "between" the voltage at the input part and the voltage at the output part, the solution according to a non-limiting embodiment may be implemented in an advantageous manner.

In an advantageous non-limiting embodiment, cutouts are provided in the printed circuit board, between the intermediate conductor track and adjacent conductor tracks of the input part or adjacent conductor tracks of the output part, for the purpose of increasing the insulation gap. These cutouts may reduce the insulation gap since they significantly increase the required creepage distances between the conductor tracks given the same spacing of the conductor tracks. The spacing between the conductor tracks may therefore be advantageously reduced, so that more space is available on the printed circuit board.

The object is further solved, according to the non-limiting embodiment, by a printed circuit board with a circuit arrangement, having an input part, which is fed by a supply voltage, and an output part, wherein the printed circuit board has, between the input part and the output part, an intermediate conductor track which has an intermediate potential which is derived from the input part, wherein the intermediate conductor track maintains a functional insulation gap from the adjacent conductor tracks of the input part, wherein the intermediate conductor track maintains a safety-relevant insulation gap from the adjacent conductor tracks of the output part, and wherein the intermediate potential has, with respect to adjacent conductor tracks of the output part, a voltage which corresponds at most to the supply voltage of the input part, or the intermediate potential has a potential with a voltage of which the value is lower than that of the voltage between the input part and the output part ($U_1$, $U_2$, $U_3$, $U_4$) with respect to a ground potential or a potential of the neutral conductor of the supply voltage. A circuit board of this kind has the advantage that it requires less surface area between the input part and the output part than the circuit boards known in the prior art in order to comply with the prescribed safety standards.

In a conventional design variant, the input part of the printed circuit board is configured such that it cannot be touched. This is already necessary on account of the mains voltage of 230 V or 120 V customary in most countries.

In one non-limiting embodiment, the output part of the printed circuit board has components which may be touched. This greatly improves the handling of the entire system since LED modules which are configured as individual circuit boards without housings are often connected to the output part, and therefore voltage-carrying potentials may be touched. Since these modules are usually operated at an SELV voltage of at most 60 V, this does not present a safety problem.

However, it is not absolutely necessary that the output part may be touched; the non-limiting embodiment also has considerable advantages over the prior art even in the case of an output part which cannot be touched.

In a non-limiting embodiment, the intermediate potential of the printed circuit board is generated from the potential at the negative output of a bridge rectifier which is located in the input part. This measure is particularly simple to implement and the potential at the negative output of a bridge rectifier which is located in the input part is particularly suitable for the method according to the non-limiting embodiment.

In an advantageous non-limiting embodiment, cutouts are provided in the printed circuit board, between the intermediate conductor track and adjacent conductor tracks of the input part of the printed circuit board or adjacent conductor tracks of the output part of the printed circuit board, for the purpose of increasing the insulation gap. These cutouts may reduce the insulation gap since they significantly increase the required creepage distances between the conductor tracks given the same spacing of the conductor tracks. The spacing between the conductor tracks may therefore be advantageously reduced, so that more space is available on the printed circuit board overall.

In a further non-limiting embodiment, the intermediate potential of the printed circuit board has a potential which corresponds to a lower voltage than the voltage between the input part and the output part with respect to a ground potential or a potential of the neutral conductor of the supply voltage. If this prerequisite is met, the solution, according to the non-limiting embodiment, may be implemented in an advantageous manner.

Further advantageous non-limiting developments and refinements of the method according to the description and of the printed circuit board according to the description may be gathered from further dependent claims and from the following description.

Two similar terms are used in the text which follows, the meaning of which terms in the following context will be briefly explained.

The creepage distance refers to the spacings, prespecified according to IEC 61347-1, between two conductive voltage-carrying parts, such as two conductor tracks, or between conductor tracks and component pads or between two component pads or two components, such as a transformer core or heat sink for example. Since a voltage breakdown usually does not form through the air here, but rather along the surface of the printed circuit board, the corresponding creepage distance between the corresponding conductive parts is critical.

Here, the voltage spacing is very generally considered to be the distance between two conductive surfaces, irrespective of the medium in which an electrical breakdown may form. The term voltage spacing is therefore more broadly formulated in the following context.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings in which:

FIG. 3 shows a schematic illustration of a non-limiting embodiment which is improved in comparison to the prior art and complies with the safety standard according to IEC 61347-1, and FIG. 4 shows a printed circuit board layout of a non-limiting embodiment which is improved in comparison to the prior art and complies with the safety standard according to IEC 61347-1.

DETAILED DESCRIPTION

FIG. 3 shows a schematic illustration of a non-limiting embodiment of the printed circuit board with a circuit arrangement arranged on it which complies with the safety standard according to IEC 61347-1. The circuit arrangement has an input part PRI and an output part SEC which have to be isolated by specific creepage distances on the printed circuit board according to the above standard. A safety-relevant creepage distance S which has to be maintained between the input part and the output part is required for the isolation. In order to reduce the creepage distances between specific components, which creepage distances are very large in practice owing to the high voltage, a conductor track 5 is inserted between the input part PRI and the output part SEC. This conductor track 5 has, as potential, an intermediate potential ZP which is derived from the input part PRI. In this embodiment, the intermediate potential ZP is the negative output of the bridge rectifier 3 in the input part. In comparison to all voltage-carrying components of the output part, the potential has a differential voltage which is not higher than the feed voltage $U_s$ of the device. Owing to this measure, the safety-relevant creepage distance is limited to the feed voltage of the device and is not particularly large. In respect of the components of the input part, it is not necessary to maintain a safety-relevant creepage distance; a functional spacing is adequate. In the case of relatively high voltages between individual components and the intermediate potential ZP, cutouts or apertures, which increase the creepage distance, may be provided in the printed circuit board.

Figure 1:
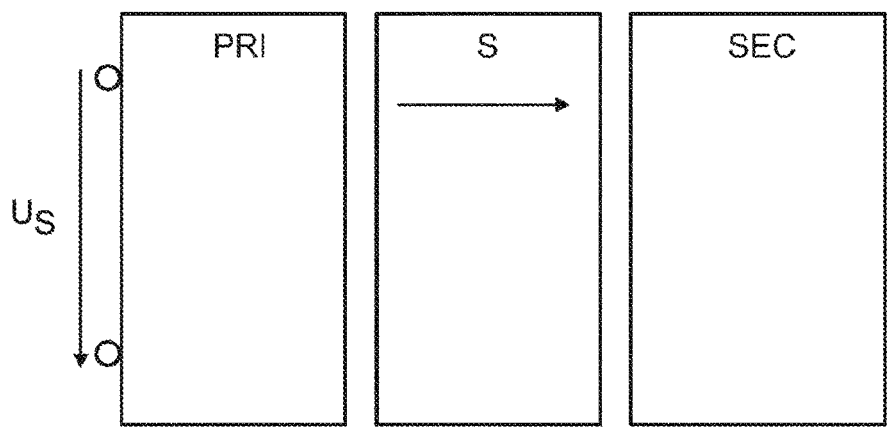
FIG. 1 shows a schematic illustration of a design according to the prior art which complies with the safety standard according to IEC 61347-1.
Figure 2:
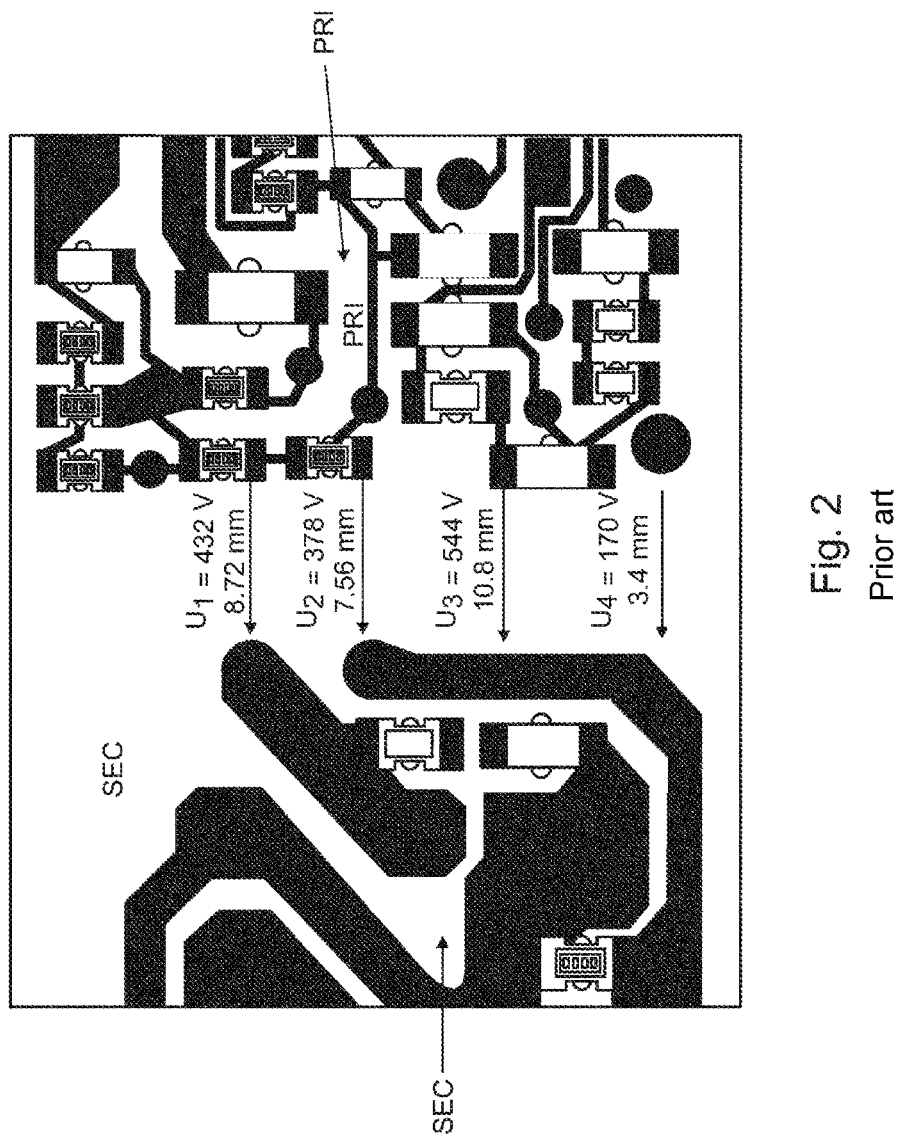
FIG. 2 shows a printed circuit board layout of a design according to the prior art which complies with the safety standard according to IEC 61347-1.

FIG. 4 shows a detail of a printed circuit board layout of a non-limiting embodiment which is compliant with the safety standard according to IEC 61347-1 in which the above designs are implemented. The conductor track 5 between the input part PRI and the output part SEC shields the components of the input part PRI from the output part SEC and in this way reduces the creepage distance by greater than 4 mm overall. Since at most 250 V are applied between the conductor track 5 and the output part SEC, only 5 mm creepage distances are prescribed here. The functional voltage spacing from the input part PRI may be further optimized by the apertures 7 since said voltage spacing increases the functional creepage distance required there and in this way reduces the real spacing between the conductor track 5 and the corresponding component. Therefore, only a spacing of 1 mm is required between the conductor track 5 and the components. The real distance between the input part and the output part therefore shrinks to 6.5 mm in comparison to 10.8 mm in the design according to FIG. 2 which corresponds to the prior art.

While the invention has been particularly shown and described with reference to specific embodiments, it should be understood by those skilled in the art that various changed in form and detail may be made therein without departing from the spirit and scope of the invention as defined by the appended claims. The scope of the invention is thus indicated by the appended claims and all changes which come within the meaning and range of equivalency of the claims are therefore intended to be embraced.

LIST OF REFERENCE SYMBOLS

3 Bridge rectifier
5 Intermediate conductor track
7 Cutouts
PRI Input part
SEC Output part
ZP Intermediate potential
F Functional insulation gap
S Safety-relevant insulation gap
$U_S$ Supply voltage
ZP Intermediate potential

The invention claimed is:

1. A method for reducing conductor track spacings in a printed circuit board, wherein the printed circuit board has an input part, wherein the input part is fed by a supply voltage, and has an output part, comprising the following steps:
- inserting an intermediate conductor track which has an intermediate potential derived from the input part,
- maintaining a functional insulation gap between the intermediate conductor track and adjacent conductor tracks of the input part,
- maintaining a safety-relevant insulation gap between the intermediate conductor track and the adjacent conductor tracks of the output part,
- wherein the intermediate potential has, with respect to adjacent conductor tracks of the output part, a voltage which corresponds at most to the supply voltage of the input part.

2. The method as claimed in claim 1, wherein the input part cannot be touched.

3. The method as claimed in claim 1, wherein the output part has components which can be touched.

4. The method as claimed in claim 1, wherein the intermediate potential is generated from the potential at the negative output of a bridge rectifier which is located in the input part.

5. The method as claimed in claim 1, wherein the intermediate potential has a potential which corresponds to a lower voltage than the voltage between the input part and the output part with respect to a ground potential or a potential of the neutral conductor of the supply voltage.

6. The method as claimed in claim 1, wherein cutouts are provided in the printed circuit board, between the intermediate conductor track and adjacent conductor tracks of the input part or adjacent conductor tracks of the output part, for the purpose of increasing the insulation gap.

7. A printed circuit board comprising a circuit arrangement, having:
- an input part fed by a supply voltage, and
- an output part,
- wherein the printed circuit board has, between the input part and the output part, an intermediate conductor track which has an intermediate potential derived from the input part,
- wherein the intermediate conductor track maintains a functional insulation gap from the adjacent conductor tracks of the input part,
- wherein the intermediate conductor track maintains a safety-relevant insulation gap from the adjacent conductor tracks of the output part,
- wherein the intermediate potential has a voltage which corresponds at most to the supply voltage of the input part with respect to adjacent conductor tracks of the output part, or the intermediate potential has a potential with a voltage of which the value is lower than that of the voltage between the input part and the output part with respect to a ground potential or a potential of the neutral conductor of the supply voltage.

8. The printed circuit board as claimed in claim 7, wherein the input part cannot be touched.

9. The printed circuit board as claimed in claim 7, wherein the output part has components which can be touched.

10. The printed circuit board as claimed in claim 7, wherein the intermediate potential is generated from the potential at the negative output of a bridge rectifier located in the input part.

11. The printed circuit board as claimed in claim 7, wherein cutouts are provided in the printed circuit board, between the intermediate conductor track and adjacent conductor tracks of the input part or adjacent conductor tracks of the output part, for the purpose of increasing the insulation gap.

12. The printed circuit board as claimed in claim 7, wherein the intermediate potential corresponds to a lower voltage than the voltage between the input part and the output part with respect to a ground potential or a potential of the neutral conductor of the supply voltage.

* * * * *